United States Patent [19]
Ishimaru

[11] Patent Number: 5,876,901
[45] Date of Patent: Mar. 2, 1999

[54] METHOD FOR FABRICATING SEMICONDUCTOR DEVICE

[75] Inventor: Yoshiteru Ishimaru, Tenri, Japan

[73] Assignee: Sharp Kabushiki Kaisha, Osaka, Japan

[21] Appl. No.: 592,966

[22] Filed: Jan. 29, 1996

[30] Foreign Application Priority Data

Jan. 31, 1995 [JP] Japan .................................... 7-013770

[51] Int. Cl.⁶ ...................................................... G03F 7/00
[52] U.S. Cl. .......................... 430/296; 430/315; 430/394; 430/942
[58] Field of Search ..................................... 430/311, 315, 430/296, 320, 329, 394, 942; 250/492.2, 492.3

[56] References Cited

U.S. PATENT DOCUMENTS

4,959,326  9/1990  Roman ....................................... 437/40
5,383,063  1/1995  Samoto ..................................... 437/40

FOREIGN PATENT DOCUMENTS

3-108343  5/1991  Japan .
6-30361   4/1994  Japan .

OTHER PUBLICATIONS

Makino et al., "Fabrication of 70nm T-shaped gate using hybrid UV/EB exposure method" *Extended Abstracts* (*The 41st Spring Meeting, 1994*); *The Japan Society of Applied Physics and Related Societies*, 30a–V–1, 1994.

Oishi et al., "Techniques for low-noise MODFETs" *National Technical Report*, (1993) 39(3):339–346.

Hosogi et al., "Photo/EB hybrid exposure process for T-shaped gate superflow-noise HEMTs" *Electronics Letters* (1991) 27(22):2011–2012.

*Primary Examiner*—Kathleen Duda
*Attorney, Agent, or Firm*—Morrison & Foerster, LLP

[57] ABSTRACT

The method for fabricating a semiconductor device according to the present includes the steps of:

forming an opening in an electron beam resist layer formed on a semiconductor substrate;

forming an opening in a photoresist layer formed on the electron beam resist layer in such a manner that the opening formed at the electron beam layer is exposed, and that the opening formed in the photoresist layer has a larger dimension than that of the opening formed in the electron beam resist layer; and forming an electrode having a T-shaped cross section by depositing an electrode material via the two openings, wherein the electron beam resist layer is formed of a polymethacrylate type electron beam resist, and the photoresist layer is formed of a styrene resin type negative resist containing a phenolic hydroxyl group.

12 Claims, 3 Drawing Sheets

METHOD FOR FABRICATING SEMICONDUCTOR DEVICE

BACKGROUND OF THE INVENTION

1. Field of the Invention

The present invention relates to a method for fabricating a semiconductor device. More specifically, the present invention relates to a method for fabricating a semiconductor device including an electrode having a T-shaped cross section.

2. Description of the Related Art

GaAs metal-semiconductor field-effect transistors (MESFETS) and AlGaAs/CaAs high electron-mobility transistors (HEMTs) are used as low-noise amplifiers in a microwave frequency range. A gate electrode in such a MESFET and a HEMT is required to have the characteristics as mentioned below in order to improve the low noise amplification characteristics: (1) the gate length coming in contact with a semiconductor substrate is short; (2) the gate electrode has a low resistance; and (3) the gate electrode reduces a parasitic resistance. For this reason, low-resistance gate electrodes having a T-shaped cross section (i.e., gate electrodes composed of a narrow lower-portion and a wide upper-portion having low resistance) have been conventionally used.

The following method is currently employed for fabricating such a T-shaped electrode: a fine pattern which defines the gate length (i.e., a pattern for forming the lower-portion of the gate electrode) is formed by using a polymethacrylate-type electron beam resist having an especially high resolution. A pattern for forming a low-resistance portion (i.e., a pattern for forming the upper-portion of the gate electrode) is formed by using a novolak type photoresist. Since a pattern for gate electrode wiring has a larger area than that of the pattern for the gate electrode portion, it is impossible to form the pattern for gate electrode wiring by using electron beam exposure as in the case of forming the pattern for the gate. The reason is that the electron beam exposure has insufficient throughput. In addition, the polymethacrylate-type electron beam resist does not react with ultraviolet rays having a long wavelength (i.e., larger than 290 nm) and visible rays, and therefore, a desired pattern cannot be formed. Accordingly, the pattern for the gate electrode wiring is usually formed by the exposure to far ultraviolet rays (having a wavelength of 290 nm or less).

However, when employing such a fabrication method, the polymethacrylate electron beam resist used for forming the pattern for the lower-portion of the gate electrode and the novolak type photoresist used for forming the pattern for the upper-portion of the gate electrode mix with each other, so that an insoluble layer is formed. As a result, the opening dimensions of the pattern used for forming the lower-portion of the gate electrode vary during the step of forming the pattern used for forming the upper-portion of the gate electrode. As a result, this method has a problem in that the pattern used for forming the upper-portion of the gate electrode must be formed while taking into account the variation of the opening dimensions of the pattern used for forming the lower-portion of the gate electrode.

Moreover, since the novolak type photoresist is a positive resist, such fabrication methods require an inversion process, in addition to an exposure process and a development process, in order to undercut the gate electrode into a desired cross-sectional shape (i.e., T-shape). Accordingly, this method has the problem of complicated processes.

Moreover, according to such fabricating methods, as described above, the gate electrode portion is exposed to an electron beam, and the gate electrode wiring portion is exposed to far ultraviolet rays. As a result, two exposure devices are required. Accordingly, this method has a problem in productivity and cost.

Thus, there is a demand for a simplified method for fabricating a semiconductor device including a T-shaped electrode, such that the opening dimensions can be precisely controlled and that excellent productivity and cost performance can be obtained.

SUMMARY OF THE INVENTION

The method for fabricating a semiconductor device according to the present invention includes the steps of:

forming an opening in an electron beam resist layer formed on a semiconductor substrate;

forming an opening in a photoresist layer formed on the electron beam resist layer in such a manner that the opening formed at the electron beam layer is exposed, and that the opening formed in the photoresist layer has a larger dimension than that of the opening formed in the electron beam resist layer; and forming an electrode having a T-shaped cross section by depositing an electrode material via the two openings, wherein the electron beam resist layer is formed of a polymethacrylate type electron beam resist, and the photoresist layer is formed of a styrene resin type negative resist containing a phenolic hydroxyl group.

In one embodiment of the invention, the polymethacrylate type electron beam resist contains polymethyl methacrylate.

In another embodiment of the invention, the polymethacrylate type electron beam resist contains a copolymer of ester methacrylate and methacrylic acid.

In still another embodiment of the invention, a molar ratio of the methacrylate to the methacrylic acid is in the range of 99:1 to 75:25.

In still another embodiment of the invention, the styrene resin type negative resist containing a phenolic hydroxyl group contains an azide compound as a photosensitizer.

In still another embodiment of the invention, the styrene resin type negative resist containing a phenolic hydroxyl group is capable of being exposed to light having a wavelength in the range of 240 to 490 nm.

Thus, the invention described herein makes possible the advantages of (1) providing a method for fabricating a semiconductor device having a T-shaped electrode such that the formation of an insoluble layer is prevented, and that the pattern opening dimensions can be precisely controlled; (2) providing a simplified method for fabricating a semiconductor device having a T-shaped electrode without requiring an inversion process; and (3) providing a method for fabricating a semiconductor device having a T-shaped electrode with excellent productivity and cost performance without requiring far ultraviolet rays exposure.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying drawings.

EXAMPLE 1

Figure 1A:
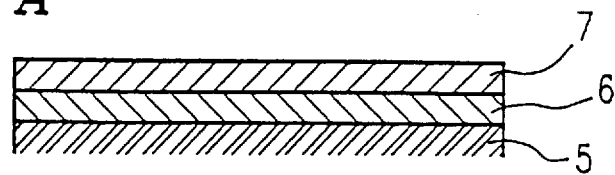
FIGS. 1A to 1D are schematic flow diagrams for describing an exemplary fabrication method according to the present invention.

As shown in FIG. 1A, an insulating layer 6 and an electron beam resist layer 7 are formed on a semiconductor substrate 5 in this order. As the semiconductor substrate 5, any well-known semiconductor material can be used. Typical examples of semiconductor materials include GaAs, InP, and the like. For the insulating layer 6, any well-known insulating material can be used. Typical examples of insulating materials include silicon oxide, silicon nitride, and the like. Examples of methods for forming an insulating layer include a chemical vapor deposition (CVD) method and the like. The thickness of the insulating layer 6 can be optimized in accordance with the specific applications; however, it is preferably 100 to 3500 Å, and more preferably, 300 to 1500 Å.

The electron beam resist layer 7 is formed of a polymethacrylate type electron beam resist. The polymethacrylate type electron beam resist is a composition containing a polymer of a methacrylate (i.e., polymethacrylate) represented by the following chemical formula (I):

(I)

where R is a hydrocarbon group having 1 to 7 atoms of carbon. A polymethacrylate type electron beam resist is preferably used for the present invention due to its excellent resolution. Especially, preferable is a polymethyl methacrylate (PMMA) type electron beam resist (in chemical formula (I), R is $CH_3$).

As the polymethacrylate type electron beam resist, a composition containing a copolymer of ester methacrylate and methacrylic acid can be also used. The copolymerization ratio of methacrylate to methacrylic acid can vary depending on the desired characteristic of the resist (e.g. adhesion and sensitivity). For example, a molar ratio of ester methacrylate to methacrylic acid is preferably in the range of 99:1 to 75:25, and more preferably, 99:1 to 90:10. As such a polymethacrylate type electron beam resist, a product designated as OEBR1000 (manufactured by Tokyo Ohka Kogyo Co., Ltd) is available.

The electron beam resist layer 7 is formed by applying and baking the above-mentioned composition (usually, the composition is employed in the form of a solution containing the above-mentioned polymer or copolymer at a predetermined concentration.). The baking temperature is preferably 120° to 250° C., and more preferably 180° to 230° C. The baking time depends on the baking temperature; however, in the case of using a hot plate, it is preferably 1 to 3 minutes, and more preferably 1 to 2 minutes, and in the case of using an oven, it is preferably 10 to 30 minutes. The thickness of the electron beam resist layer 7 can vary depending on the application; however, it is preferably 500 to 2500 Å, and more preferably, 750 to 1500 Å. The baking is usually performed on a hot plate.

Figure 1B:
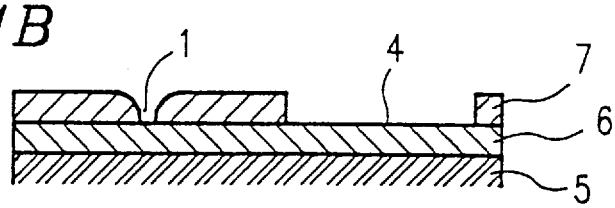

Next, as shown in FIG. 1B, a gate electrode opening 1 and a gate electrode wiring opening 4 are formed in desired portions of the electron beam resist layer 7. Specifically, desired portions of the electron beam resist layer 7 are irradiated with an electron beam at a desired irradiation amount. For example, the irradiation amount on the gate forming portion is preferably 0.5 to 3.0 nC/cm, and more preferably 1.0 to 3.0 nC/cm; the irradiation amount on the gate electrode wiring forming portion is preferably 100 to 400 $\mu C/cm^2$, and more preferably 150 to 300 $\mu C/cm^2$. However, the irradiation amount can vary depending on the sensitivity of the resist and the composition of the developer described below. Then, by immersing the semiconductor substrate 5 thus-obtained into a predetermined developer so as to perform development, the portion irradiated with the electron beam dissolves into the developer, so that an opening is formed in a desired pattern (e.g. the opening 1 for the gate electrode and the opening 4 for the gate electrode wiring). Examples of the developer include isopropanol, 4-methyl-2-pentanone (MIBK), and the like. The immersion into the developer is preferably performed for 0.2 to 60 minutes, and more preferably 1 to 35 minutes; however, the immersion time can vary depending on the irradiation amount and the composition of the developer. The immersion into the developer is usually performed at room temperature. Usually, the width of the resultant opening 1 for the gate electrode is preferably 0.08 to 0.30 $\mu$m, and more preferably 0.10 to 0.25 $\mu$m.

Next, a photoresist layer 8 is formed on the electron beam resist layer 7, on which the desired pattern is formed as mentioned above. The photoresist layer 8 is formed of a styrene resin type negative resist containing a phenolic hydroxyl group. The styrene resin type negative resist containing a phenolic hydroxyl group is a composition containing a polymer represented by the following chemical formula (II):

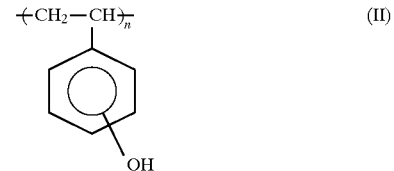

(II)

This resist preferably contains an, azide compound as a photosensitizer. This resist reacts with a beam having a wavelength of 240 to 490 nm (ultraviolet rays and visible rays), and can be developed by an organic alkaline developer. That is, this resist does not require exposure to far ultraviolet rays. As such a styrene resin type negative resist containing phenolic hydroxyl group, products designated as RU1100N, RG3000N, and RD2000 (manufactured by Hitachi Chemical Co., Ltd.) are available.

The photoresist layer 8 is formed by applying and baking the above-mentioned composition (usually, the composition is employed in the form of a solution containing a polymer represented by chemical formula (II) at a predetermined concentration). The baking temperature is preferably 70° to 110° C., and more preferably 80° to 100° C. The baking time depends on the baking temperature; however, in the case of using a hot plate, it is preferably 1 to 3 minutes, and more preferably 1 to 2 minutes, and in the case of using an oven, it is preferably 15 to 30 minutes. The thickness of the photoresist layer 8 can vary depending on the application; however, it is preferably 6000 to 10000 Å, and more preferably 7000 to 9000 Å. The baking is usually performed on a hot plate.

Figure 1C:
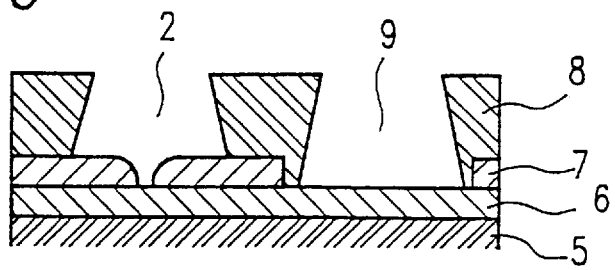

Next, as shown in FIG. 1C, opening patterns having desired cross-sectional shapes (for example, an opening pattern 2 for the gate electrode and an opening pattern 9 for the gate electrode wiring) are formed. For example, when RU1100N is used as the styrene resin type negative resist containing a phenolic hydroxyl group, the photoresist layer 8 is exposed by using an i-line stepper (wavelength of 365 nm) in such a manner that the opening 1 for the gate electrode and the opening 4 for the gate electrode wiring are exposed. Then, the photoresist layer 8 is developed by a developer specially designed for that purpose, so that the opening pattern 2 for the gate electrode and the opening pattern 9 for the gate electrode wiring are formed. The amount of exposure to light and development time can vary depending on the desired shape; however, the amount of exposure to light is preferably 120 to 180 mJ/cm$^2$, and more preferably 140 to 160 mJ/cm$^2$; and the development time is preferably 2 to 6 minutes, and more preferably 3 to 5 minutes. In accordance with the kind of styrene resin type negative resist containing phenolic hydroxyl group used therein, a g-line stepper (wavelength of 436 nm), a KrF excimer laser stepper (wavelength of 248 nm), and the like can be used for the exposure. For example, when the resist is RG3000N, the g-line stepper is preferably used, and when the resist is RD2000, the KrF excimer laser stepper is preferably used.

The opening pattern 2 for the gate electrode has, for example, a T-shaped cross-section shown in FIG. 1C. The width of the uppermost-portion of the T-shaped opening pattern is, for example, 0.80 to 1.20 μm.

Figure 1D:
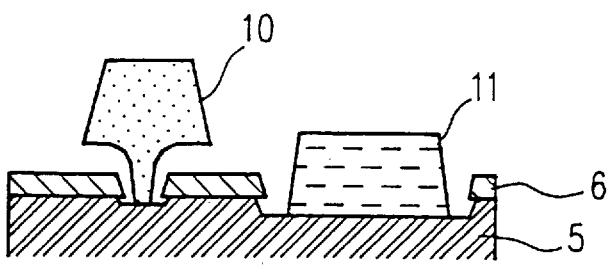

Next, as shown in FIG. 1D, a T-shaped gate electrode 10 and gate electrode wiring portion 11 are formed. Specifically, the formation of the gate electrode 10 and the gate electrode wiring portion 11 is conducted through the following procedure: The insulating layer 6 is etched so that the semiconductor substrate 5 is exposed. As necessary, the semiconductor substrate 5 is etched so that a gate recess is formed. Then, a metal for the gate is deposited. As the metal for the gate, any well-known metallic material for gates can be used. The typical examples of such metallic materials include aluminum (Al), titanium (Ti), Gold (Au), molybdenum (Mo), and the like. Finally, the electron beam resist layer 7, the photoresist layer 8, and the excess metal attached to these resist layers are removed by a lift-off method, so that the T-shaped gate electrode 10 and the gate electrode wiring portion 11 are formed. The lift-off is achieved, for example, by immersing the substrate on which the metal is deposited into an organic solvent e.g., acetone.

EXAMPLE 2

Figure 2A:
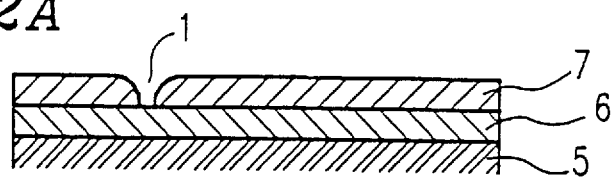
FIGS. 2A to 2C are schematic flow diagrams for describing another exemplary fabrication method according to the present invention.

As shown in FIG. 2A, gate electrode opening 1 is formed in the same manner as Example 1.

Next, a photoresist layer 28 made of a styrene resin type negative resist containing a phenolic hydroxyl group is formed. The photoresist layer 28 is formed, for example, by applying and baking a product designated as RU1100N (manufactured by Hitachi Chemical Industry Co., Ltd.). The baking temperature is preferably 70° to 110° C., and more preferably 80° to 100° C. The baking time depends on the baking temperature; however, in the case of using a hot plate, it is preferably 1 to 3 minutes, and more preferably 1 to 2 minutes. The thickness of the photoresist layer 28 can vary depending on the application; however, it is preferably 6000 to 10000 Å, and more preferably 7000 to 9000 Å. Usually, the baking is conducted on a hot plate.

Figure 2B:
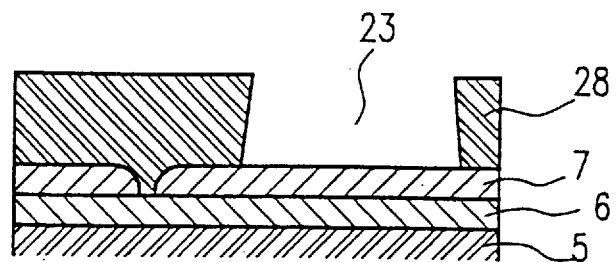

Next, as shown in FIG. 2B, an opening 23 for a gate electrode wiring is formed in a desired portion of the photoresist layer 28. For example, when RU1100N is used as the styrene resin type negative resist containing a phenolic hydroxyl group, the photoresist 28 is exposed by using an i-line stepper (wavelength of 365 nm), and then the photoresist 28 is developed by a developer specially designed for that purpose. As a result, an opening 23 for the gate electrode wiring is formed in a desired portion of the photoresist layer 28. The amount of exposure to light and the development time can vary depending on the desired shape; however, the amount of exposure to light is preferably 120 to 180 mJ/cm$^2$, and more preferably 140 to 160 mJ/cm$^2$; and the development time is preferably 2 to 6 minutes, and more preferably 3 to 5 minutes.

Figure 2C:
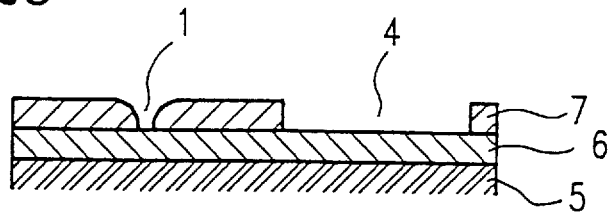

Next, as shown in FIG. 2C, an opening 4 for the gate electrode wiring is formed in a desired portion of an electron beam resist layer 7. Specifically, the formation of the opening 4 for the gate electrode wiring on the electron beam resist layer 7 is conducted through the following procedure: the electron beam resist layer 7 is removed by oxygen plasma ashing using the photoresist layer 28 as a mask. Since the etching rate of styrene resin type negative resist containing phenolic hydroxyl group by the oxygen plasma ashing is approximately two thirds of that of a polymethacrylate type electron beam resist, the photoresist layer 28 sufficiently serves as a mask. Moreover, when an opening is formed by dry etching, the photoresist 28 sufficiently serves as a mask by optimizing the etching selection ratio and the thickness of the photoresist layer 28 and the electron beam resist layer 7. Next, the photoresist layer 28 is removed by using preferably a high-concentration organic alkaline aqueous solution (e.g. an NMD-3 manufactured by Tokyo Ohka Kogyo Co., Ltd.), so that the opening 4 for the gate electrode wiring is formed in the desired portion of the electron beam resist layer 7, as shown in FIG. 2C. The reason why a high concentration of organic alkaline aqueous solution is preferred for removing the photoresist layer 2 is that the polymethacrylate type resist (the electron beam resist layer 7) does not dissolve in a high-concentration organic alkaline aqueous solution. Accordingly, it is possible to easily and selectively remove the photoresist layer 28 alone without deforming the pattern on the electron beam resist layer 7.

The subsequent process is the same as that of Example 1. As a result, the T-shaped gate electrode 10 and the gate electrode wiring portion 11 as shown in FIG. 1D are formed.

EXAMPLE 3

Figure 3A:
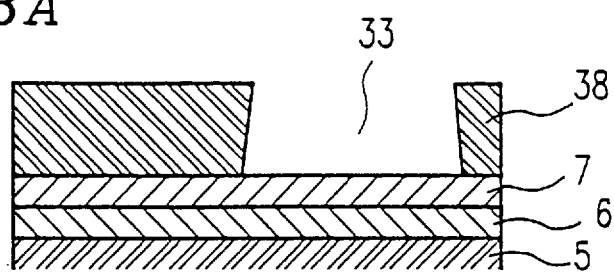
FIGS. 3A to 3C are schematic flow diagrams for describing still another exemplary fabrication method according to the present invention.

An insulating layer 6 and an electron beam resist layer 7 are formed on a semiconductor substrate 5 in this order in the same manner as described in Example 1. Next, a photoresist layer 38 is formed on the electron beam resist layer 7 in the same manner as described in Example 2. Then, the photoresist layer 38 is exposed to light and developed, so that an opening 33 for the gate electrode wiring is formed in a desired portion of the photoresist 38, as shown in FIG. 3A.

Figure 3B:
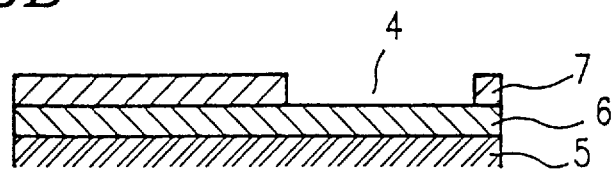

Next, an opening 4 for the gate electrode wiring is formed in a desired portion of the electron beam resist layer 7 as shown in FIG. 3B in the same manner described in Example 2.

Figure 3C:
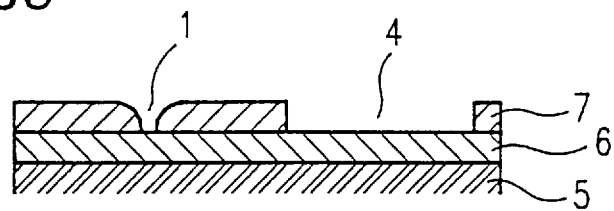

Furthermore, an opening 1 for the gate electrode is formed in a desired portion of the electron beam resist layer 7 as shown in FIG. 3C in the same manner described in Example 1.

The subsequent process is the same as that described in Example 1. As a result, the T-shaped gate electrode 10 and the gate electrode wiring portion 11 as shown in FIG. 1D are formed.

According to the present invention, the dimensions of the opening used for forming the lower-portion of the gate electrode do not vary during the process of forming the pattern for forming the lower-portion of the gate electrode, because a styrene resin type negative resist containing a phenolic hydroxyl group, used as a photoresist, does not form an insoluble layer between a polymethacrylate type electron beam resist and itself, unlike in the case of novolak type resists. This results from the difference in molecular structure between a polymer which is a main component of novolak type resist and a polymer which is a main component of a styrene resin type negative resist containing phenolic hydroxyl group.

The polymer which is the main component of a conventionally used novolak type photoresist is a polymer having a main chain composed of repeating units of a novolak resin structure (i.e., repeating units containing an aromatic ring) as shown in the following chemical formula (III):

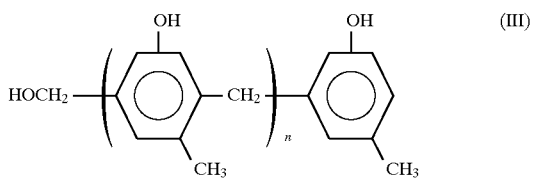

This polymer has a molecular structure remarkably different from that of the polymer which is the main component of polymethacrylate type electron beam resist. That is, the polymer which is the main component of polymethacrylate type electron beam resist is a polymer having a main chain composed of the repeating units of polyethylene resin structure (that is, the unit having no aromatic rings) as shown in the following chemical formula (I):

Thus, the molecular structures of the polymers which are the main components of the respective resists are remarkably different from each other, so that even if a small amount of one resist is mixed with the other, the characteristics of the other resist significantly change. As a result, the mechanism of the resist exposure and development significantly changes. This invites the problem of an insoluble layer being formed as an undeveloped mixture, which hinders precisely-controlled development (that is, the pattern formation).

On the other hand, the polymer which is the main component of a styrene resin type resist containing a phenolic hydroxyl group used in the present invention has a molecular structure relatively similar to that of the polymer which is the main component of a polymethacrylate type electron beam resist, as shown in the following chemical formula (II). That is, the polymer which is the main component of styrene resin type resist containing phenolic hydroxyl group is a polymer having a main chain composed of repeating units of a polyethylene resin structure, similar to the polymer which is the main component of polymethacrylate type electron beam resist.

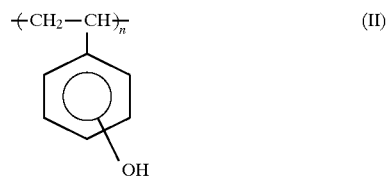

Thus, the polymers which are the main components of the respective resists according to the present invention have relatively similar molecular structures to each other, so that if small amounts of the resists are mixed with each other, the characteristics of resists do not change substantially. Accordingly, the mechanism of the resist exposure and development do not change substantially, and therefore, no insoluble layer is formed as a non-developed mixture. As a result, a precisely controlled pattern formation can be achieved.

Furthermore, a styrene resin type resist containing a phenolic hydroxyl group is a negative resist. Therefore, the fabrication method of the present invention does not require any inversion processes unlike in the case where a novolak type photoresist is used. That is, the gate electrode can be undercut so as to have a desired cross-sectional shape (i.e., T-shape) only by usual exposure and development processes. As a result, the fabrication process is remarkably simplified.

Furthermore, a styrene resin type resist containing a phenolic hydroxyl group allows development through exposure to light having a wavelength of 240 nm to 490 nm. Accordingly, the fabrication method of the present invention does not require any far ultraviolet rays exposure device for exposing a large area, e.g., a gate electrode wiring portion, to light. That is, a gate electrode wiring portion can be easily formed on a polymethacrylate type electron beam resist by using a generally-used exposure device, such as a stepper. As a result, the productivity and cost performance are remarkably improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor device comprising the steps of:

forming an opening in an electron beam resist layer formed on a semiconductor substrate;

forming an opening in a photoresist layer formed on the electron beam resist layer in such a manner that the opening formed at the electron beam layer is exposed, and that the opening formed in the photoresist layer has a larger dimension than that of the opening formed in the electron beam resist layer; and forming an electrode having a T-shaped cross section by depositing an electrode material via the two openings, wherein the electron beam resist layer is formed of a polymethacrylate electron beam resist, and the photoresist layer is formed of a styrene resin negative resist containing a phenolic hydroxyl group.

2. A method for fabricating a semiconductor device according to claim 1, wherein the polymethacrylate electron beam resist contains polymethyl methacrylate.

3. A method for fabricating a semiconductor device according to claim 1, wherein the polymethacrylate electron beam resist contains a copolymer of methacrylate and methacrylic acid.

4. A method for fabricating a semiconductor device according to claim 3, wherein the molar ratio of the methacrylate to the methacrylic acid is in the range of 99:1 to 75:25.

5. A method for fabricating a semiconductor device according to claim 1, wherein the styrene resin negative resist containing a phenolic hydroxyl group contains an azide compound as a photosensitizer.

6. A method for fabricating a semiconductor device according to claim 1, wherein the styrene resin negative resist containing a phenolic hydroxyl group is sensitive to light having a wavelength in the range of 240 to 490 nm.

7. A method for fabricating a semiconductor device comprising the steps of:

forming an insulating layer on a semiconductor substrate;

forming an electron beam resist layer on the insulating layer;

forming an opening in the electron beam resist layer;

forming a photoresist layer;

forming an opening in the photoresist layer in such a manner that the opening formed at the electron beam layer is exposed, and that the opening formed in the photoresist layer has a larger dimension than that of the opening formed in the electron beam resist layer; and forming an electrode having a T-shaped cross section by depositing an electrode material via the two openings, wherein the electron beam resist layer is formed of a polymethacrylate electron beam resist, and the photoresist layer is formed of a styrene resin negative resist containing a phenolic hydroxyl group.

8. A method for fabricating a semiconductor device according to claim 7, wherein the polymethacrylate electron beam resist contains polymethyl methacrylate.

9. A method for fabricating a semiconductor device according to claim 7, wherein the polymethacrylate electron beam resist contains a copolymer of methacrylate and methacrylic acid.

10. A method for fabricating a semiconductor device according to claim 9, wherein the molar ratio of the methacrylate to the methacrylic acid is in the range of 99:1 to 75:25.

11. A method for fabricating a semiconductor device according to claim 7, wherein the styrene resin negative resist containing a phenolic hydroxyl group contains an azide compound as a photosensitizer.

12. A method for fabricating a semiconductor device according to claim 7, wherein the styrene resin negative resist containing a phenolic hydroxyl group is sensitive to light having a wavelength in the range of 240 to 490 nm.

* * * * *